(12) United States Patent
Ishida et al.

(10) Patent No.: US 7,439,621 B1
(45) Date of Patent: Oct. 21, 2008

(54) RADIO FREQUENCY SIGNAL PROCESSING DEVICE

(75) Inventors: Hidetoshi Ishida, Kyoto (JP); Kazuo Miyatsuji, Osaka (JP); Hidetoshi Furukawa, Osaka (JP); Tsuyoshi Tanaka, Osaka (JP); Daisuke Ueda, Osaka (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/707,844

(22) Filed: Nov. 8, 2000

(51) Int. Cl.
*H01L 23/34* (2006.01)
*H01L 23/552* (2006.01)
(52) U.S. Cl. .............. 257/728; 257/E23.114; 257/659; 257/660
(58) Field of Classification Search ........ 257/651, 257/758, 728, 730, 731, 288, 289, 368, 379, 257/382, 383, 384, 390, 391, 499, 506, 508, 257/774, 778, 502
See application file for complete search history.

(56) References Cited

U.S. PATENT DOCUMENTS

| | | | | |
|---|---|---|---|---|
| 3,969,745 A | * | 7/1976 | Blocker, III | 257/276 |
| 5,151,770 A | * | 9/1992 | Inoue | 257/660 |
| 5,485,039 A | * | 1/1996 | Fujita et al. | 257/774 |
| 5,933,364 A | * | 8/1999 | Aoyama et al. | 365/63 |
| 5,959,905 A | * | 9/1999 | Payne | 365/200 |
| 6,133,628 A | * | 10/2000 | Dawson | 257/698 |
| 6,229,209 B1 | * | 5/2001 | Nakamura et al. | 257/737 |
| 6,313,512 B1 | * | 11/2001 | Schmitz et al. | 257/401 |

FOREIGN PATENT DOCUMENTS

| | | |
|---|---|---|
| JP | 62-62452 A | 4/1987 |
| JP | 63-67295 A | 5/1988 |
| JP | 64-27298 A | 1/1989 |
| JP | 2-226801 A | 9/1990 |
| JP | 03-165058 | 7/1991 |
| JP | 3-165058 A | 7/1991 |
| JP | 03-286559 | 12/1991 |
| JP | 04-176162 | 6/1992 |
| JP | 6-41230 | 5/1994 |
| JP | 6-52191 | 7/1994 |
| JP | 08-064987 | 3/1996 |
| JP | 08-148570 | 6/1996 |
| JP | 09-307060 | 11/1997 |

OTHER PUBLICATIONS

Final Decision for U.S. Appl. No. 10/110,481, dated Feb. 21, 2006.

\* cited by examiner

*Primary Examiner*—David A Zarneke
(74) *Attorney, Agent, or Firm*—Nixon Peabody LLP; Jeffrey L. Costellia (57) ABSTRACT

The RF device of the present invention includes: a semiconductor substrate; and first and second semiconductor components provided on the substrate. Each of the components includes source electrodes, a gate electrode and a drain electrode. And multiple through holes, which pass through the substrate in the thickness direction, are opened in a region of the substrate between the two components. To enhance the effect of suppressing electrical interference between the components, a gap between two adjacent ones of the through holes is preferably smaller than the thickness of the substrate.

11 Claims, 7 Drawing Sheets

RADIO FREQUENCY SIGNAL PROCESSING DEVICE

BACKGROUND OF THE INVENTION

The present invention generally relates to a semiconductor device for processing a radio frequency (RF) signal, and more particularly relates to an RF device for amplifying power of an RF signal in a mobile communications unit such as a cellular phone.

In recent years, as mobile communications units, e.g., cellular phones, have been popularized, it has become more and more necessary to cut down on the costs of RF devices build in those mobile communications units. Although a known RF device has been implemented using multiple chips (each including a single power-amplifying transistor for an RF signal thereon), a state-of-the-art RF device is implemented using a single chip including multiple power-amplifying transistors thereon.

In this case, those transistors might sometimes affect each another electrically because not so large a space as that of a conventional device is allowed between the transistors. Therefore, there is a problem that the RF characteristic of the overall device degrades compared to the conventional RF device that is implemented using multiple chips.

To solve this problem, a technique of providing an RF signal isolating groove between the adjacent transistors on the substrate of the RF device was developed.

Figure 7A:
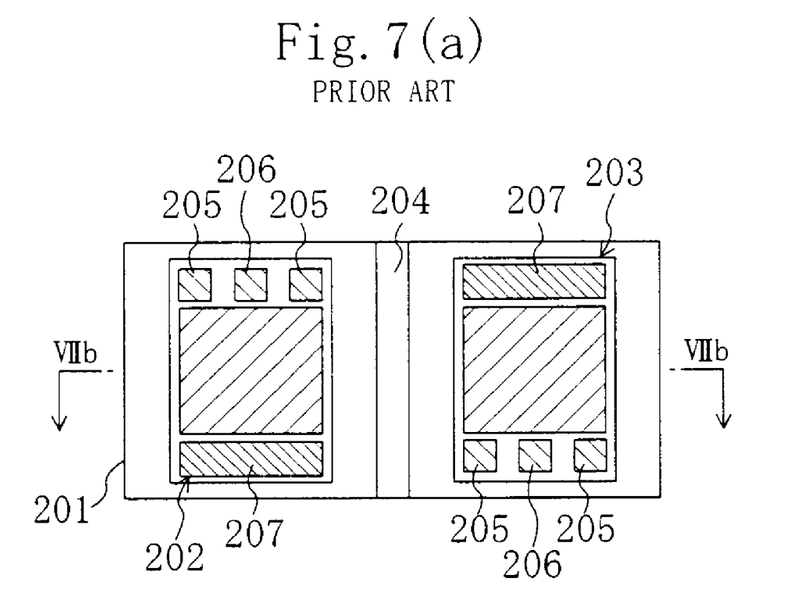
FIGS. 7(a) and 7(b) are a plan view of a known RF device including an RF signal isolating groove and a cross-sectional view of the device taken along the line VIIb-VIIb in FIG. 7(a), respectively.
Figure 7B:
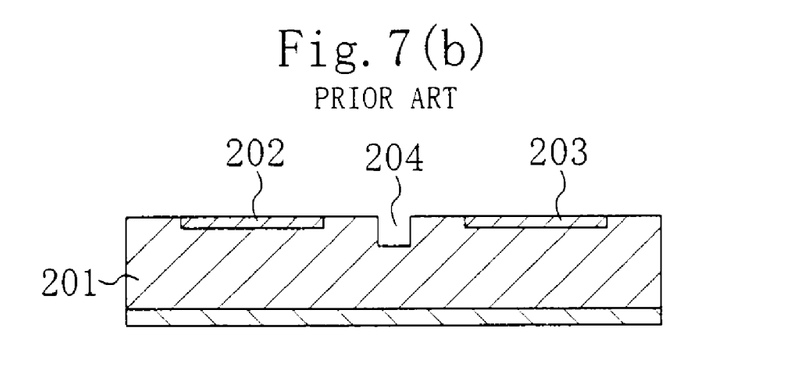

FIGS. 7(a) and 7(b) are respectively a plan view of a known RF device including an RF signal isolating groove and a cross-sectional view of the device taken along the line VIIb-VIIb in FIG. 7(a).

As shown in FIGS. 7(a) and 7(b), first and second power-amplifying FETs (field effect transistors) 202 and 203 are provided on a semiconductor substrate 201. And an RF signal isolating groove 204 is formed between the first and second FETs 202 and 203 in the semiconductor substrate 201. Also, each of the first and second FETs 202 and 203 includes source electrodes 205, a gate electrode 206 and a drain electrode 207.

The RF device shown in FIGS. 7(a) and 7(b) realizes an RF characteristic with rather good linearity, because the RF signal isolating groove 204 is formed between the two FETs 202 and 203 to suppress electrical interference between the FETs 202 and 203.

However, if the RF signal isolating groove 204 shown in FIGS. 7(a) and 7(b) is too shallow, the groove 204 might not function properly in suppressing the electrical interference. On the other hand, if the groove 204 is too deep, the semiconductor substrate 201 might be destroyed.

SUMMARY OF THE INVENTION

It is therefore an object of the present invention to suppress electrical interference between adjacent ones of power-amplifying transistors in an RF semiconductor device, which is implemented by providing the transistors on a semiconductor substrate without destroying the substrate.

A first semiconductor device according to the present invention includes: a semiconductor substrate; at least two semiconductor components provided on the principal surface of the substrate; and multiple through holes, which pass from the principal surface through the backside of the substrate and are provided in a region of the substrate between the at least two components.

According to the present invention, the electrical interference of signals between the two components can be suppressed by the multiple through holes.

In one embodiment of the present invention, a gap between two adjacent ones of the through holes is preferably smaller than the thickness of the substrate because it was found that the effect of suppressing the electrical interference is particularly noticeable in that case.

In another embodiment of the present invention, the device preferably further includes a conductor film on the side faces of the through holes, because the signal shielding function can be further improved.

In this particular embodiment, the device preferably further includes a grounded wiring layer on the backside of the substrate and the conductor film formed on the side faces of the through holes are preferably connected to the grounded wiring layer, because the effect of suppressing the electrical interference can be particularly enhanced.

A second semiconductor device according to the present invention includes: a semiconductor substrate; at least two semiconductor components provided on the principal surface of the substrate; electrodes of the components provided on the substrate; a first group of through holes, which pass from the principal surface through the backside of the substrate and are provided in respective regions of the substrate under the electrodes; a first conductor film provided on the side faces of the first group of through holes; a second group of through holes, which pass from the principal surface through the backside of the substrate and are provided in a region of the substrate between the components; a second conductor film provided on the side faces of the second group of through holes; and a wiring layer, which is provided on the backside of the substrate and is in contact with the first and second conductor films.

According to this invention, the first and second conductor films are connected together through the wiring layer. Therefore, the electrical interference between the at least two components can be suppressed effectively.

DESCRIPTION OF THE PREFERRED EMBODIMENTS

Embodiment 1

Figure 1A:
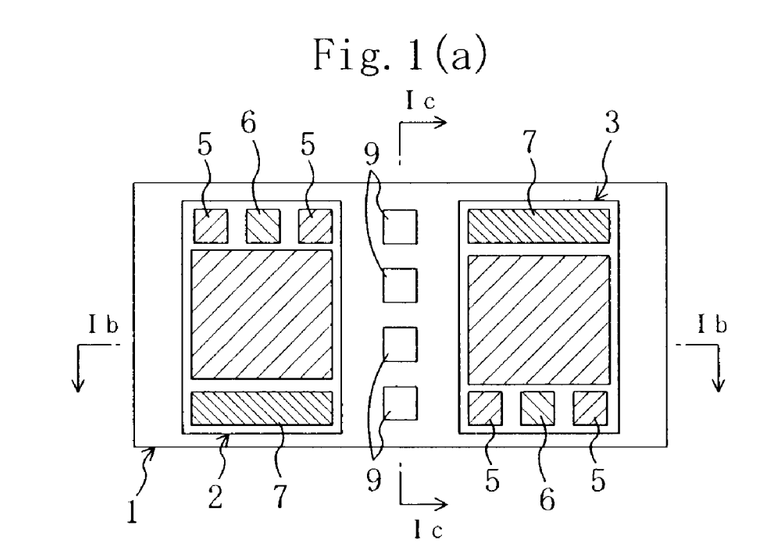
FIGS. 1(a), 1(b) and 1(c) are respectively a plan view of an RF device in a first embodiment of the present invention, a cross-sectional view of the device taken along the line Ib-Ib in FIG. 1(a) and a cross-sectional view of the device taken along the line Ic-Ic in FIG. 1(a).
Figure 1B:
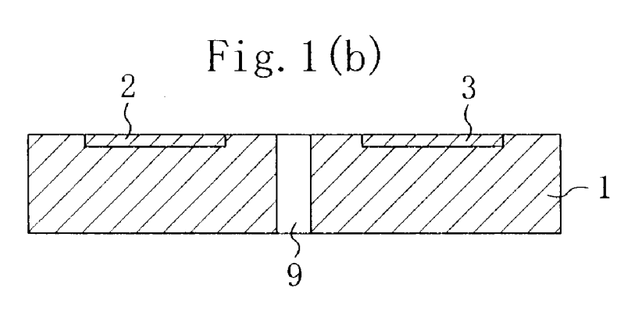
Figure 1C:
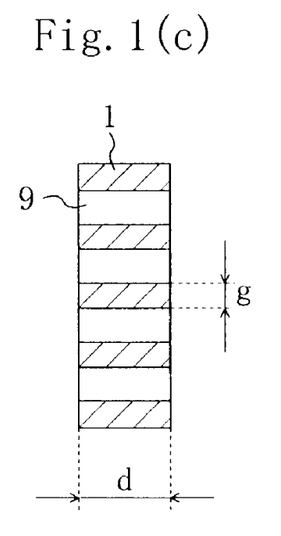
Figure 2:
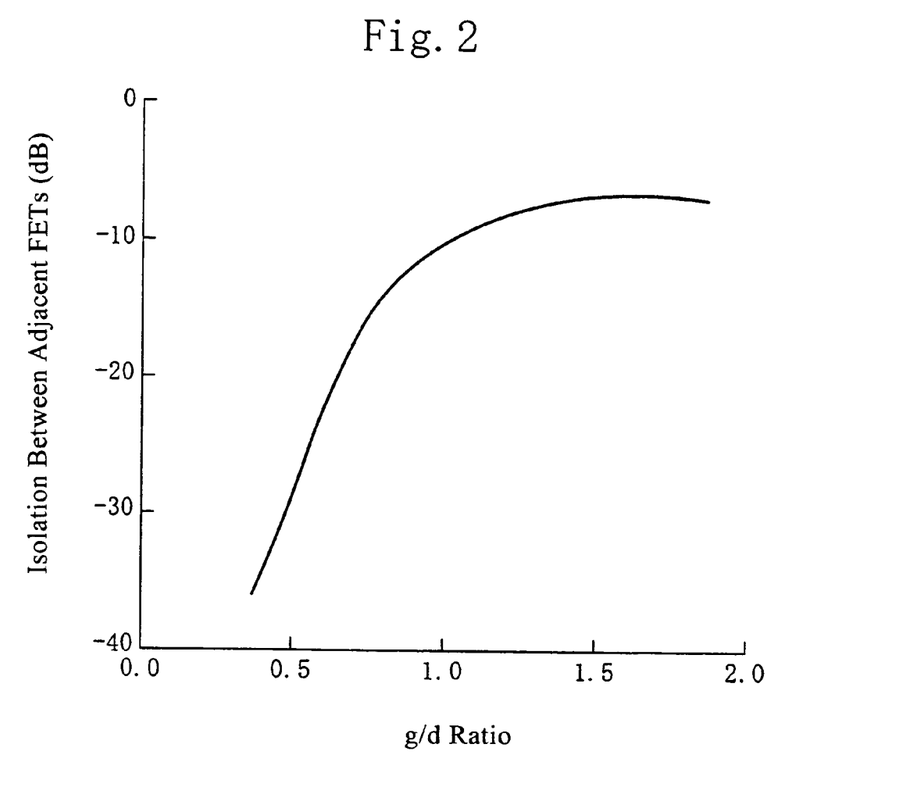
FIG. 2 is a graph illustrating the g/d ratio dependence of isolation between adjacent FETs obtained by the present inventors.

FIGS. 1(a), 1(b) and 1(c) are respectively a plan view of an RF device in a first embodiment of the present invention, a cross-sectional view of the device taken along the line Ib-Ib in FIG. 1(a) and a cross-sectional view of the device taken along the line Ic-Ic in FIG. 1(a).

As shown in FIGS. 1(a) through 1(c), the RF device of this embodiment includes: a semiconductor substrate 1 made of a compound semiconductor (e.g., GaAs); and first and second FETs 2 and 3 (i.e., exemplary first and second active components) provided on the semiconductor substrate 1. Also, each of the FETs 2 and 3 includes source electrodes 5, a gate electrode 6 and a drain electrode 7.

This embodiment is characterized in that four through holes 9, which pass through the semiconductor substrate 1 in the thickness direction, are provided in a region between the two FETs 2 and 3 on the semiconductor substrate 1. In this embodiment, the thickness d of the semiconductor substrate 1 is 100 μm and a gap g between each adjacent pair of through holes 9 is 50 μm as shown in FIG. 1(c). According to results of experiments carried out by the present inventors, it was found that g is preferably smaller than d to enhance the effect of suppressing electrical interference between the FETs 2 and 3 as will be described later. However, g does not have to be smaller than d.

According to this embodiment, by providing the multiple through holes 9 between the two FETs 2 and 3, the electrical interference between the FETs 2 and 3 can be suppressed. We also found that the electrical interference between the two FETs 2 and 3 is much more likely to be suppressed noticeably by appropriately adjusting the gap between each adjacent pair of through holes 9. In addition, if the diameter of the through holes 9 is adjusted, the semiconductor substrate 1 is much less likely to be destroyed while the through holes 9 are being opened or after the through holes 9 have been opened. Therefore, according to this embodiment, it is possible to prevent the semiconductor substrate 1 from being destroyed, and it is also possible to substantially eliminate.

Figure 3A:
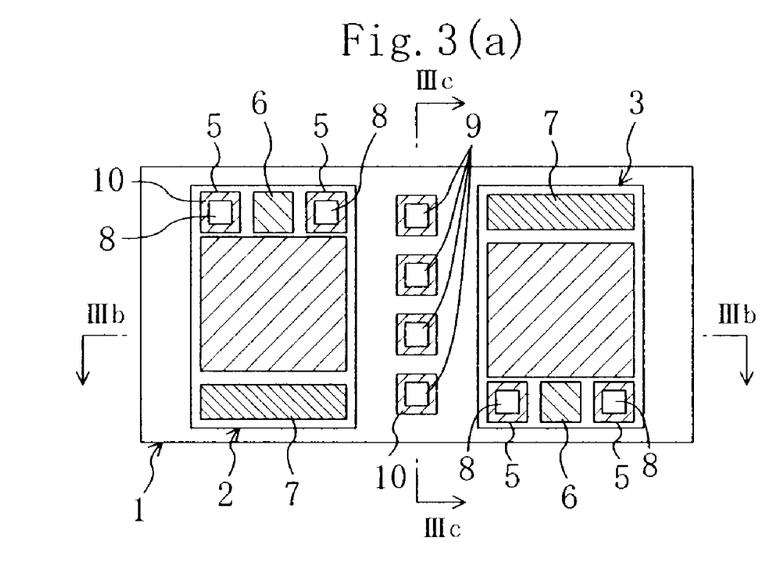
FIGS. 3(a), 3(b) and 3(c) are respectively a plan view of an RF device in a second embodiment of the present invention, a cross-sectional view of the device taken along the line IIIb-IIIb in FIG. 3(a) and a cross-sectional view of the device taken along the line IIIc-IIIc in FIG. 3(a).
Figure 3B:
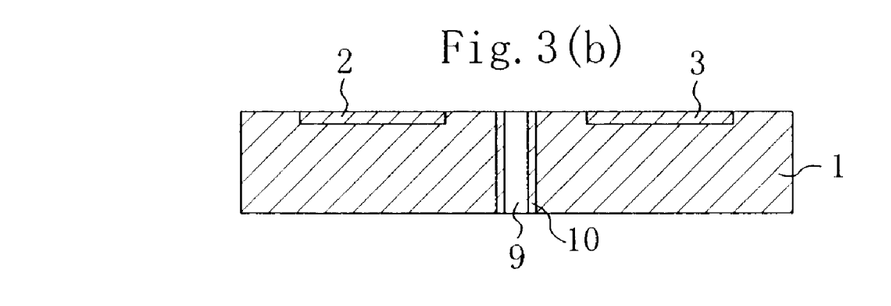
Figure 3C:
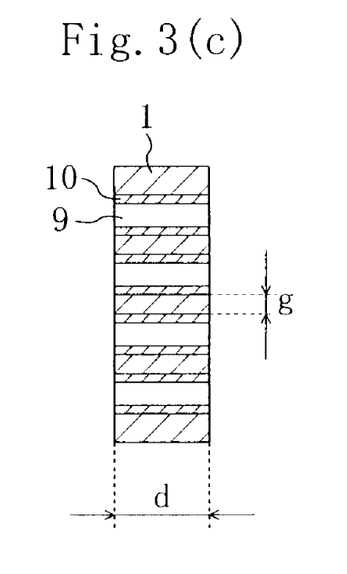

As shown in FIGS. 3(a) through 3(c), the RF device of this embodiment includes: a semiconductor substrate 1 made of a compound semiconductor (e.g., GaAs); and first and second FETs 2 and 3 provided on the semiconductor substrate 1. Also, each of the FETs 2 and 3 includes source electrodes 5, a gate electrode 6 and a drain electrode 7. Further, through holes 8, which pass through the semiconductor substrate 1 in the thickness direction, are opened through portions of the semiconductor substrate 1 under the source electrodes 5, and a conductor film 10 is formed out of a gold plated layer with a thickness of about 2 μm on the side faces of the through holes 8.

This embodiment is characterized in that the four through holes 9, which pass through the semiconductor substrate 1 in the thickness direction, are opened in a region of the substrate 1 between the two FETs 2 and 3, and that the conductor film 10 is also formed on the side faces of these through holes 9.

In this embodiment, the thickness d of the semiconductor substrate 1 is also 100 μm and a gap g between each adjacent pair of through holes 9 is also 50 μm as shown in FIG. 3(c).

That is to say, in this embodiment, g is also smaller than d. However, g does not have to be smaller than d.

According to this embodiment, by appropriately adjusting the gap between each adjacent pair of through holes 9, the electrical interference between the two FETs 2 and 3 is much more likely to be suppressed as in the first embodiment. In addition, if the diameter of the through holes 9 is adjusted, the semiconductor substrate 1 is much less likely to be destroyed while the through holes 9 are being opened or after the through holes 9 have been opened.

Furthermore, according to this embodiment, the conductor film 10 is formed out of a gold plated layer, for example, on the side faces of the through holes 9. Therefore, the through holes 9 can have its function of reducing the RF leakage enhanced by the conductor film 10 and the electrical interference between the two FETs 2 and 3 is much more likely to be eliminated.

It should be noted that the through holes 9 can be opened while the through holes 8 are being opened under the source electrodes 5. Therefore, the number of process steps, e.g., photolithography or etching process, does not increase.

Embodiment 3

Figure 4A:
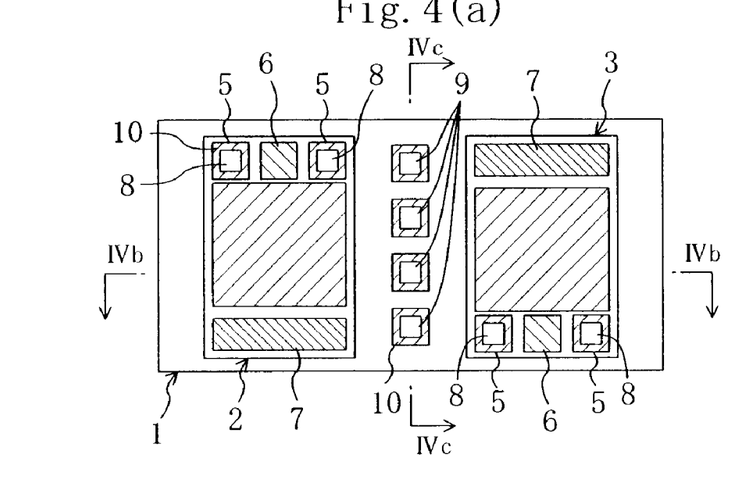
FIGS. 4(a), 4(b) and 4(c) are respectively a plan view of an RF device in a third embodiment of the present invention, a cross-sectional view of the device taken along the line IVb-IVb in FIG. 4(a) and a cross-sectional view of the device taken along the line IVc-IVc in FIG. 4(a).
Figure 4B:
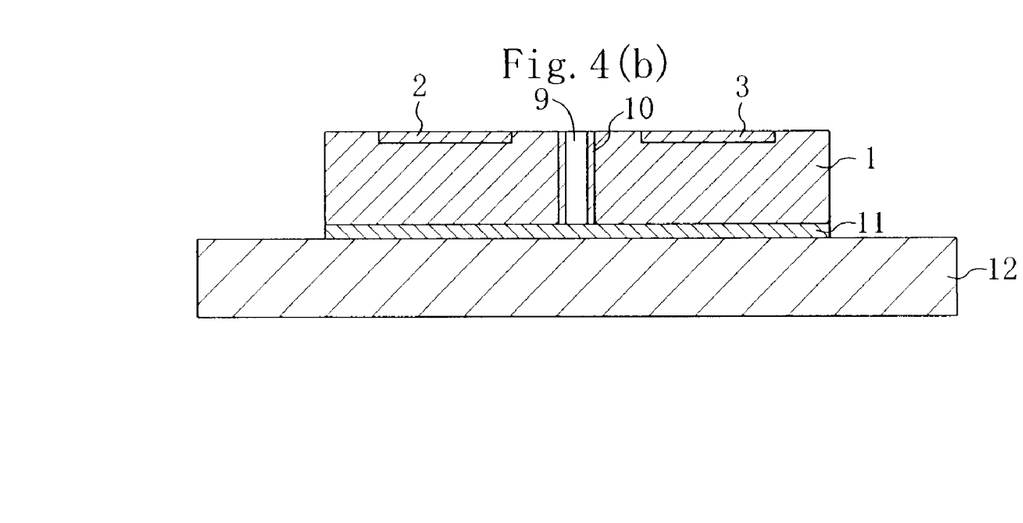
Figure 4C:
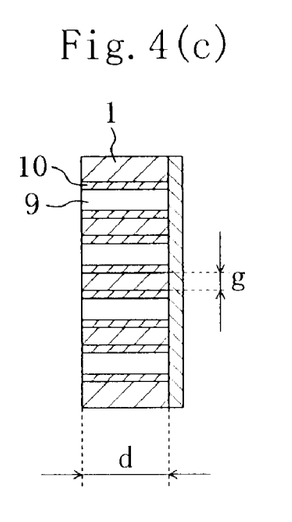

FIGS. 4(a), 4(b) and 4(c) are respectively a plan view of an RF device in a third embodiment of the present invention, a cross-sectional view of the device taken along the line IVb-IVb in FIG. 4(a) and a cross-sectional view of the device taken along the line IVc-IVc in FIG. 4(a).

As shown in FIGS. 4(a) through 4(c), the RF device of this embodiment includes: a semiconductor substrate 1 made of a compound semiconductor (e.g., GaAs); and first and second FETs 2 and 3 provided on the semiconductor substrate 1. A grounded wiring layer 11 is formed over the entire backside of the semiconductor substrate 1 and the substrate 1 is mounted over a die pad 12 with the grounded wiring layer 11 interposed therebetween. And each of the FETs 2 and 3 includes source electrodes 5, a gate electrode 6 and a drain electrode 7. Further, through holes 8, which pass through the semiconductor substrate 1 in the thickness direction, are opened through portions of the substrate 1 under the source electrodes 5. And a conductor film 10 is formed out of a gold plated layer with a thickness of about 2 μm on the side faces of the through holes 8. The source electrodes 5 and grounded wiring layer 11 are electrically connected together through the conductor film 10.

This embodiment is characterized in that the four through holes 9, which pass through the semiconductor substrate 1 in the thickness direction, are opened in a region of the substrate 1 between the two FETs 2 and 3, and that the conductor film 10 is also formed on the side faces of these through holes 9. The conductor film 10 on the side faces of these through holes 9 is also connected to the grounded wiring layer 11. Therefore, in this embodiment, the conductor film 10, formed on the side faces of the through holes 9, and the source electrodes 5 are maintained at almost the same potential levels (i.e., around ground level) while the RF device is being operated.

In this embodiment, the thickness d of the semiconductor substrate 1 is also 100 μm and a gap g between each adjacent pair of through holes 9 is also 50 μm as shown in FIG. 4(c). That is to say, in this embodiment, g is also smaller than d. However, g does not have to be smaller than d.

According to this embodiment, the electrical interference between the two FETs 2 and 3 is much more likely to be suppressed by the through holes 9. In addition, if the diameter of the through holes 9 is adjusted, the semiconductor substrate 1 is much less likely to be destroyed while the through holes 9 are being opened or after the through holes 9 have been opened.

Furthermore, according to this embodiment, the conductor film 10 is formed out of a gold plated layer, for example, on the side faces of the through holes 9. Therefore, the through holes 9 can have its function of reducing the RF signal leakage enhanced by the conductor film 10 and the electrical interference between the two FETs 2 and 3 is much more likely to be eliminated.

Moreover, in this embodiment, the conductor film 10 formed on the side faces of the through holes 9 and the source electrodes 5 are maintained at almost the same potential levels (i.e., around ground level). Therefore, the conductor film 10 can further improve the function of shielding the RF power leakage from the FET 2 or 3 and the electrical interference between the two FETs 2 and 3 can be eliminated more effectively.

It should be noted that the through holes 9 can be opened while the through holes 8 are being opened under the source electrodes 5. Therefore, the number of process steps, e.g., photolithography or etching process, does not increase. In other words, there is no need to add the process of forming a member for grounding the source electrodes 5.

Embodiment 4

Figure 5A:
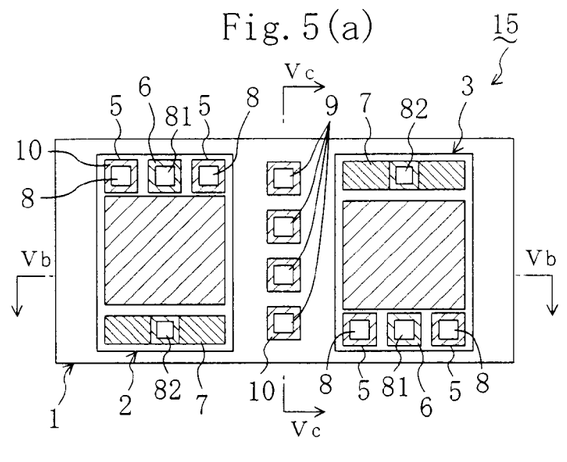
FIGS. 5(a), 5(b), 5(c) and 5(d) are respectively a plan view illustrating the principal surface of an RF device in a fourth embodiment of the present invention, a cross-sectional view of the device taken along the line Vb-Vb in FIG. 5(a), a cross-sectional view of the device taken along the line Vc-Vc in FIG. 5(a) and a plan view illustrating the backside of the RF device.

FIGS. 5(a), 5(b), 5(c) and 5(d) are respectively a plan view illustrating the principal surface of an RF device in a fourth embodiment of the present invention, a cross-sectional view of the device taken along the line Vb-Vb in FIG. 5(a), a cross-sectional view of the device taken along the line Vc-Vc in FIG. 5(a) and a plan view illustrating the backside of the RF device.

Figure 5B:
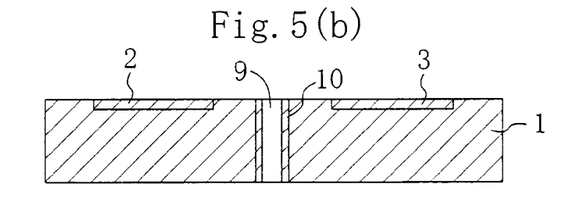
Figure 5C:
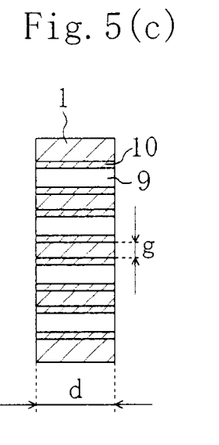

As shown in FIGS. 5(a) through 5(c), the RF device 15 of this embodiment includes: a semiconductor substrate 1 made of a compound semiconductor (e.g., GaAs); and first and second FETs 2 and 3 provided on the semiconductor substrate 1. Each of the FETs 2 and 3 includes source electrodes 5, a gate electrode 6 and a drain electrode 7. Further, through holes 8, 81 and 82, which pass through the semiconductor substrate 1 in the thickness direction, are opened through portions of the semiconductor substrate 1 under the source electrodes 5, the gate electrode 6 and the drain electrode 7, respectively. And a conductor film 10 is formed out of a gold plated layer with a thickness of about 2 μm on the side faces of the through holes 8, 81 and 82. Another four through holes 9, which also pass through the semiconductor substrate 1 in the thickness direction, are opened in a region of the substrate 1 between the two FETs 2 and 3. And the conductor film 10 is also formed on the side faces of these through holes 9.

Figure 5D:
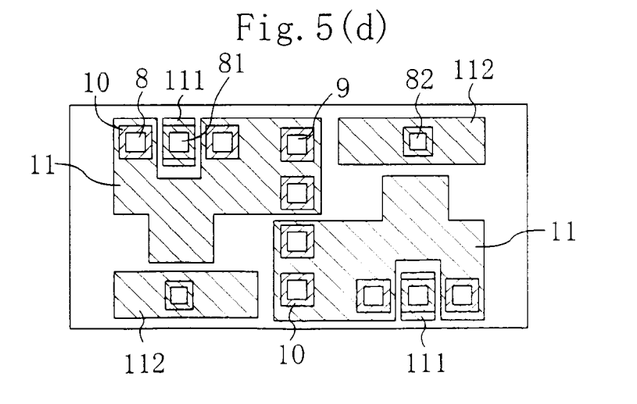

As shown in FIG. 5(d), a grounded wiring layer 11, two wiring regions 111 and another two wiring regions 112 are provided on the backside of the semiconductor substrate 1. The grounded wiring layer 11 surrounds not only the through holes 8 under the source electrodes 5 but also the through holes 9. Each of the wiring regions 111 surrounds the through hole 81 under the associated one of the gate electrodes 6. And each of the wiring regions 112 surrounds the through hole 82 under the associated one of the drain electrodes 7. Each pair of the source electrodes 5 and the grounded wiring layer 11 are electrically connected together through the conductor film 10 formed on the side faces of the through holes 8 under the pair of source electrodes 5. And the grounded wiring layer 11 and the conductor film 10 formed on the side faces of the through holes 9 are electrically connected together. Also, each of the gate electrodes 6 and associated one of the wiring regions 111 are electrically connected together through the conductor film 10 formed on the side faces of the associated through hole 81. And each of the drain electrodes 7 and associated one of the wiring regions 112 are electrically connected together through the conductor film 10 formed on the side faces of the associated through hole 82.

In this embodiment, the four through holes 9, which pass through the semiconductor substrate 1 in the thickness direction, are opened in the region of the substrate 1 between the two FETs 2 and 3. And the conductor film 10, which is connected to the grounded wiring layer 11, is also formed on the side faces of these through holes 9. Therefore, the conductor film 10, formed on the side faces of the through holes 9, and the source electrodes 5 are maintained at almost the same potential levels (i.e., around ground level) while the RF device is being operated.

In this embodiment, the thickness d of the semiconductor substrate 1 is also 100 μm and a gap g between each adjacent pair of through holes 9 is also 50 μm as shown in FIG. 5(c). That is to say, in this embodiment, g is also smaller than d. However, g does not have to be smaller than d.

Figure 6:
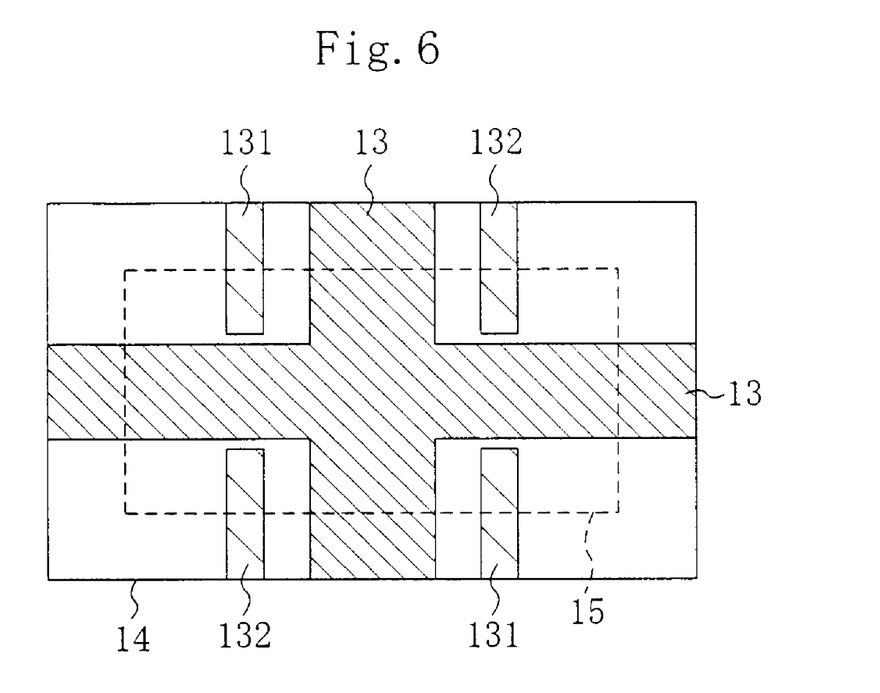
FIG. 6 is a plan view of a printed circuit board 14 on which the RF device 15 shown in FIGS. 5(a) through 5(d) is mounted.

FIG. 6 is a plan view of a printed circuit board (PCB) 14 on which the RF device 15 shown in FIGS. 5(a) through 5(d) is mounted. As shown in FIG. 6, a grounded wiring layer 13, gate lines 131 and drain lines 132 are provided on the principal surface of the PCB 14. The RF device 15 is mounted on the PCB 14 in such a manner that the grounded wiring layer 11 of the RF device 15 is connected to the grounded wiring layer 13 on the PCB 14, the wiring regions 111 of the RF device 15 are connected to the gate lines 131 on the PCB 14 and the wiring regions 112 of the RF device 15 are connected to the drain lines 132 on the PCB 14. By mounting the RF device 15 on the PCB 14 in this manner, an RF module can be formed.

According to this embodiment, in addition to the construction of the third embodiment, the gate electrodes 6 are connected to the gate lines 131 on the PCB 14 via the conductor film 10 formed on the side faces of the through holes 81 under the gate electrodes 6. And the drain electrodes 7 are connected to the drain lines 132 on the PCB 14 via the conductor film 10 formed on the side faces of the through holes 82 under the drain electrodes 7. Therefore, a voltage can be easily applied to these electrodes 5, 6 and 7 through the grounded wiring layer 13 and the gate and drain lines 131 and 132 formed on the PCB 14. That is to say, not only the effects of the third embodiment are attained but also the RF module, which is implemented by mounting the RF device 15 on the PCB 14, can be smaller in size.

It should be noted that the through holes 9, 81 and 82 can be opened while the through holes 8 are being opened under the source electrodes 5. Therefore, the number of process steps, e.g., photolithography or etching process, does not increase. In other words, there is no need to add the process of forming a member for grounding the source electrodes 5.

It should also be noted that FETs, which are exemplary power amplifiers, are provided as semiconductor components in the foregoing embodiments, but bipolar transistors may be provided instead of the FETs.

Furthermore, when passive components, e.g., capacitors or conductors, are provided as the two semiconductor components, the function of reducing the electrical interference between these two semiconductor components can be obtained by providing the through holes of the present invention between the components.

Moreover, a semiconductor device including two semiconductor components is described in the foregoing embodiments. However, the present invention is applicable to a semiconductor device including three or more components. In that case, the through holes need to be provided between each pair of the components.

What is claimed is:

1. An RF device comprising:
    a plurality of semiconductor elements formed on a semiconductor substrate composed of a semiconductor material;
    a plurality of through holes which are provided between two adjacent ones of the plurality of semiconductor elements and pass from a surface through the backside of the semiconductor substrate,
    wherein a distance between two adjacent ones of the plurality of through holes is smaller than a thickness of the semiconductor substrate so as to reduce power leaking between two adjacent ones of the plurality of semiconductor elements.

2. The device of claim 1, wherein side faces of the plurality of through holes are covered with a conductive material.

3. The device of claim 2, wherein the conductive material is electrically connected to a ground wiring layer provided on the surface of the backside of the semiconductor substrate.

4. The device of claim 1, wherein the semiconductor substrate is a GaAs substrate.

5. An RF device comprising:
    a plurality of semiconductor elements formed on a semiconductor substrate composed of a semiconductor material;
    a first group of through holes which are provided between two adjacent ones of the plurality of semiconductor elements and pass from a surface through the backside of the semiconductor substrate and whose side faces are covered with a conductive material; and
    a second group of through holes which are provided in electrodes of the plurality of semiconductor elements, pass from a surface through the backside of the semiconductor substrate, and whose side faces are covered with the conductive material,
    wherein the conductive material which covers side faces of the first and second groups of through holes is electrically connected to a first wiring layer provided on the backside of the semiconductor substrate, and
    a distance between two adjacent ones of the first group of through holes is smaller than a thickness of the semiconductor substrate so as to reduce power leaking between two adjacent ones of the plurality of semiconductor elements.

6. The device of claim 5, wherein the semiconductor substrate is a GaAs substrate.

7. The RF device of claim 1,
    wherein the distance between two adjacent ones of the plurality of through holes is smaller than a thickness of the semiconductor substrate so as to exponentially reduce power leaking between two adjacent ones of the plurality of semiconductor elements with regard to the distance between two adjacent ones of the plurality of through holes.

8. The RF device of claim 5,
    wherein the distance between two adjacent ones of the first group of through holes is smaller than a thickness of the semiconductor substrate so as to exponentially reduce power leaking between two adjacent ones of the plurality of semiconductor elements with regard to the distance between two adjacent ones of the first group of through holes.

9. The RF device of claim 5,
    wherein some through holes of the first group and some through holes of the second group are electrically connected to the first wiring layer, and
    some of the other through holes of the first group and some of the other through holes of the second group are electrically connected to a second wiring layer.

10. The RE device of claim 9,
    wherein a grounded wiring layer is formed on a printed circuit board, and
    the first and second wiring layers are electrically connected to the grounded wiring layer.

11. The RF device of claim 10,
    wherein a third wiring layer other than the grounded wiring layer is formed on the printed circuit board, and
    one of the through holes of the second group is electrically connected to the third wiring layer.

* * * * *